US010224676B2

(12) United States Patent
Hemmerlein et al.

(10) Patent No.: US 10,224,676 B2
(45) Date of Patent: Mar. 5, 2019

(54) SHIELDED CONNECTION LINE FOR MAGNETIC RESONANCE TOMOGRAPHY SYSTEM

(71) Applicants: Martin Hemmerlein, Bamberg (DE); Wolfgang Kraus, Nürnberg (DE); Thomas Kundner, Buckenhof (DE)

(72) Inventors: Martin Hemmerlein, Bamberg (DE); Wolfgang Kraus, Nürnberg (DE); Thomas Kundner, Buckenhof (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 15/602,361

(22) Filed: May 23, 2017

(65) Prior Publication Data
US 2017/0338599 A1 Nov. 23, 2017

(30) Foreign Application Priority Data
May 23, 2016 (DE) .................. 10 2016 208 847

(51) Int. Cl.
G01R 33/3415 (2006.01)
H01R 13/04 (2006.01)
(Continued)

(52) U.S. Cl.
CPC ... *H01R 13/6581* (2013.01); *G01R 33/34007* (2013.01); *G01R 33/3415* (2013.01);
(Continued)

(58) Field of Classification Search
USPC .................. 324/300–322; 600/407–435; 382/128–131
See application file for complete search history.

(56) References Cited

U.S. PATENT DOCUMENTS 7,747,310 B2 * 6/2010 Misic .................. G01R 33/285
600/423
7,885,704 B2 * 2/2011 Misic .................. A61B 5/055
600/423
(Continued)

FOREIGN PATENT DOCUMENTS

CN 1875524 A 12/2006
CN 1885623 A 12/2006
(Continued)

OTHER PUBLICATIONS

German Office Action for German Application No. 10 2016 208 847.3 dated Feb. 8, 2017, with English Translation.
(Continued)

Primary Examiner — Melissa Koval
Assistant Examiner — Tiffany Fetzner
(74) Attorney, Agent, or Firm — Lempia Summerfield Katz LLC

(57) ABSTRACT

A shielded connection line for a magnetic resonance tomography system includes a signal conductor, a shield for the signal conductor, and a plug-in connector. The plug-in connector has a large number of connection contacts that are arranged in a two-dimensional matrix and are electrically insulated from each other in the plug-in connector. The signal conductor is in galvanic contact with a first connection contact, and three second connection contacts adjacent to the first connection contact and surrounding the first connection contact are galvanically connected to the shield.

16 Claims, 3 Drawing Sheets

(51) Int. Cl.

| | | |
|---|---|---|
| *H01R 13/17* | (2006.01) | |
| *H01R 24/22* | (2011.01) | |
| *H01R 24/30* | (2011.01) | |
| *G01R 33/36* | (2006.01) | |
| *G01R 33/422* | (2006.01) | |
| *G01R 33/341* | (2006.01) | |
| *H01R 13/6581* | (2011.01) | |
| *G01R 33/34* | (2006.01) | |
| *H01F 7/20* | (2006.01) | |
| *H01F 27/29* | (2006.01) | |
| *H01R 13/6592* | (2011.01) | |
| *H01R 107/00* | (2006.01) | |
| *H01F 27/36* | (2006.01) | |

(52) U.S. Cl.
CPC ........... *G01R 33/36* (2013.01); *G01R 33/422* (2013.01); *H01F 7/202* (2013.01); *H01R 13/04* (2013.01); *H01R 13/17* (2013.01); *H01R 24/22* (2013.01); *H01R 24/30* (2013.01); *G01R 33/341* (2013.01); *H01F 27/29* (2013.01); *H01F 27/362* (2013.01); *H01R 13/6592* (2013.01); *H01R 2107/00* (2013.01)

(56) References Cited

U.S. PATENT DOCUMENTS

| | | | | |
|---|---|---|---|---|
| 8,207,737 B2 * | 6/2012 | Greim | ................ | G01R 33/3685 324/309 |
| 8,324,899 B2 * | 12/2012 | Hoogeveen | ........ | G01R 33/3692 324/318 |
| 8,989,841 B2 * | 3/2015 | Misic | ................... | G01R 33/285 600/410 |
| 2004/0236209 A1 * | 11/2004 | Misic | ................... | G01R 33/285 600/423 |
| 2006/0292921 A1 | 12/2006 | Dahms et al. | | |
| 2007/0049112 A1 | 3/2007 | Friese et al. | | |
| 2009/0030305 A1 * | 1/2009 | Hoogeveen | ........ | G01R 33/3621 600/422 |
| 2009/0076378 A1 * | 3/2009 | Misic | ..................... | A61B 5/055 600/423 |
| 2010/0148775 A1 * | 6/2010 | Greim | .................. | A61B 5/0555 324/309 |
| 2011/0081800 A1 | 4/2011 | Heise et al. | | |
| 2011/0125005 A1 * | 5/2011 | Misic | ................... | G01R 33/285 600/423 |
| 2015/0331074 A1 * | 11/2015 | Biber | ..................... | G01R 33/36 324/322 |
| 2017/0317439 A1 | 11/2017 | Zebhauser et al. | | |
| 2017/0338599 A1 * | 11/2017 | Hemmerlein | ....... | H01R 13/6581 |
| 2018/0088192 A1 * | 3/2018 | Kundner | ............. | G01R 33/288 |

FOREIGN PATENT DOCUMENTS

| | | |
|---|---|---|
| CN | 101278206 A | 10/2008 |
| CN | 102037617 A | 4/2011 |
| CN | 107112661 A | 8/2017 |
| DE | 4109863 C2 | 3/1993 |
| DE | 102008031990 B3 | 4/2010 |

OTHER PUBLICATIONS

Chinese Office Action for Chinese Application No. 201710362530.4 dated May 9, 2018, with English Translation.

* cited by examiner

SHIELDED CONNECTION LINE FOR MAGNETIC RESONANCE TOMOGRAPHY SYSTEM

This application claims the benefit of DE 10 2016 208 847.5, filed on May 23, 2016, which is hereby incorporated by reference in its entirety.

BACKGROUND

The present embodiments relate to a shielded connection line for a magnetic resonance tomography system.

Magnetic resonance tomography systems are imaging devices that, for mapping an examination object, align nuclear spins of the examination object using a strong external magnetic field and excite the nuclear spins to precession around this alignment via a magnetic alternating field. The precession or return of the spins from this excited state into a state with lower energy generates a magnetic alternating field (e.g., a magnetic resonance signal) as a response that is received by antennae.

With the aid of magnetic gradient fields, a spatial encoding is impressed on the signals, and this subsequently enables allocation of the received signal to a volume element. The received signal is then evaluated, and a three-dimensional imaging representation of the examination object is supplied.

Magnetic alternating fields having a frequency corresponding to the Larmor frequency at the respective static magnetic field strength, and very high field strengths or outputs are to be provided for excitation of the precession of the spins. Antennae, which are often referred to as local coils and are arranged directly on the patient, are used to improve the signal-to-noise ratio of the magnetic resonance signal received by the antennae.

For imaging, the magnetic resonance signals received by the local coil are to be transmitted to a receiver of the magnetic resonance tomography system.

Coaxial cables or bundles of coaxial cables, which are provided with plugs at one end in order to connect to the magnetic resonance tomography system and to allow use of different local coils, are frequently used for transmitting the signals. Specific plugs for coaxial cables are expensive and laborious to manufacture. Most coaxial cable plug systems are not configured for frequent actuation (e.g., frequent change of local coils) either. Due to complex three-dimensional structures such as cylindrical indentations, the sockets (e.g., provided) are difficult to clean and disinfect.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a connection line for a magnetic resonance tomography system that is simpler to handle and less expensive is provided.

The connection line of one or more of the present embodiments is a shielded connection line for a magnetic resonance tomography system. The shielded connection line has a signal conductor and a shield for the signal conductor. A shield is made from a conductive material and surrounds the signal conductor along an outer peripheral extent. A material that predefines the spacing and insulates the signal conductor from the shield may be located between the signal conductor and the shield. The shield may be, for example, a cylindrical mesh made of metal wires that are spaced apart from the signal conductor in the center of the insulator by a cylindrical insulation (e.g., made of Teflon). The electrical properties of the shielded connection line essentially result from the geometry of the line and the material of the insulation.

The connection line also has a plug-in connector. The plug-in connector has a large number of connection contacts that are arranged in a two-dimensional matrix and are insulated from each other in the plug-in connector. In other words, the connection contacts are arranged distributed over a surface, but may project from this surface depending on the embodiment. The connection contacts may be configured, for example, as pins or elastic contact strips that extend away from the surface, or as contact surfaces or landing surfaces that are arranged on or in the surface. The connection contacts may be located, for example, at the intersection points of a grid, in a different regular arrangement, or in an irregular arrangement.

The signal conductor of the connection line is in galvanic contact with a first connection contact, and at least three second connection contacts adjacent to the first connection contact and surrounding the first connection contact are galvanically connected to the shield of the signal conductor (e.g., directly and without any additional bypasses that noticeably change the high-frequency properties of the connection between the shield and the second connection contacts in a frequency range of signals to be transmitted with the connection line). The relevant frequency range is, for example, the frequency range of the Larmor frequency, a reference clock, or a different signal in a different frequency range below, for example, between 5 and 20 MHz. Within the scope of the present embodiments, "adjacent" may be that there are no further first signal contacts arranged between the first connection contact and one of the second connection contacts that transmit a different signal. Consequently, there may not be any other connection contacts (e.g., no signal conductors for a different signal) arranged between a first connection contact of a signal conductor and a second connection contact that is connected to the shield of the signal conductor. In one embodiment, however, two signal conductors jointly carry one signal as a symmetrical signal line and have a shared shield. Within the scope of the present embodiments, these two interrelated signal conductors and corresponding linked connection contacts are regarded as a single signal conductor or first connection contact.

The arrangement of the second connection contacts around a first connection contact allows the effect of the shield to continue in and beyond the plug-in connector and without providing complex and sensitive coaxial connectors having a simpler connection line.

A local coil, a system including a connection line and a socket, and a magnetic resonance tomography system of the present embodiments share the advantages of the shielded connection line.

In one embodiment of the connection line, the second contacts are arranged at the corners of a polygon, a surface of which the first connection contact is arranged. The polygon may be, for example, a triangle, rectangle, pentagon, hexagon, or a polygon that may be arranged in an extensive pattern. The polygon defines a surface or even an inner surface that is delimited by connecting lines of adjacent corners. The first connection contact is arranged in the inner surface of the polygon. Embodiments having a plurality of first connection contacts in the inner surface may also be provided (e.g., for shielded symmetrical signal links, such as twisted signal conductor pairs).

The arrangement of the second connection contacts at corners or in polygons improves the shielding effect and the high-frequency properties of a connection with the shielded connection line.

In one embodiment of the shielded connection line, only one first connection contact is arranged in the surface of the polygon.

The embodiment having just one first connection contact is particularly suitable for asymmetrical signal links having just one signal conductor in the shield.

In one possible embodiment of the connection line, the polygon is a convex polygon.

With geometry, a convex polygon approximates a coaxial connection in which the shield is arranged all around and at a constant spacing and therefore has advantageous properties with respect to characteristic wave impedance and shield.

In one embodiment of the shielded connection line, the connection line has a plurality of signal conductors each having a shield. In other words, the connection line has a plurality of signal conductors that have separate shields that are isolated from each other. Each signal conductor of the plurality of signal conductors is in galvanic contact with a first connection contact. At least three second contacts adjacent to the first connection contact and surrounding the first connection contact are galvanically connected to the respective separate shield of the signal conductor.

Plug-in connectors are available for one embodiment of a transmission device. The plug-in connectors provide a large number of connection contacts in a matrix (e.g., more than 50 or 100). Using plug-in connectors of this kind, a large number of coaxial conductors of a connection line may be connected to a single plug-in connector without impeding the transmission properties.

In one possible embodiment of the shielded connection line, the shields of the plurality of signal conductors are not in electrical contact with each other at the plug-in connector. In one embodiment, the shields are connected to each other and/or to a central ground at a different location.

Independent shields, which have only one shared ground pin, reduce crosstalk between signal conductors and prevent the formation of ground loops that are to be avoided, for example, with respect to currents that are induced by the gradient coils.

In one embodiment, a system includes a shielded connection line and a socket. The socket has third and fourth connection contacts. The plug-in connector and the socket are configured, in the plugged-in state, to electrically connect the first and the third connection contacts to each other in pairs, respectively, and to electrically connect the second and the fourth connection contacts to each other in pairs, respectively.

The system including shielded connection line and socket allows an inexpensive, detachable shielded connection to be provided (e.g., between a local coil and a magnetic resonance tomography system).

In one possible embodiment of the system, the socket and the plug-in connector are configured such that, in the plugged-in state, a conductive path formed by a first connection contact and third connection contact is in each case surrounded by adjacent conductive paths that are formed by the second connection contacts and the fourth connection contacts.

The system advantageously enables the shielded connection to be continued while largely retaining the electrical properties (e.g., with respect to high-frequency properties and characteristic wave impedance) beyond a detachable plug-in connection by also providing a shield of the signal conductor in the plug-in connector via adjacent second and fourth connection contacts.

In one embodiment of the system, one of the first connection contact, second connection contact, third connection contact, or fourth connection contact has a spring contact. In one embodiment, only the first and second connection contacts or the third and fourth connection contacts have spring contacts. The first and the second connection contacts, for example, have spring contacts.

Spring contacts also provide reliable electrical connections even in vibrating environments, such as in the patient tunnel. The plug-in connection including plug-in connector and socket closes against the force of the spring contacts, so, for example, the contacts also press on the surface through contamination and provide a reliable contact closure.

In one embodiment of the system, the socket and the plug-in connector have a restraining system having corresponding retaining elements. The retaining elements are arranged and configured such that under the pressure of the spring contact(s), the retaining elements detachably fix the plug-in connector in a predetermined relative position to the socket. For example, the socket may have an undercut and the plug-in connector may have a corresponding projection, with corresponding oblique planes with respect to the direction of force of the spring contacts. The projection is thus pressed behind the undercut as a result of the spring force, and the plug-in connector detachably locks with the socket.

The spring contacts in conjunction with the retaining elements easily and reliably provide locking of the plug-in connection for the shielded cable.

In one embodiment of the system, the socket has planar landing surfaces or contact surfaces as the connection contact. Planar landing surfaces are planar metallic contacts that are essentially flat. The planar landing surfaces are part of a closed surface of the socket (e.g., the planar landing surface are embedded in an insulating material in a planar manner in a two-dimensional matrix).

Planar landing surfaces (e.g., embedded in a planar insulating element) allow straightforward cleaning due to the closed and essentially smooth surface.

DETAILED DESCRIPTION

Figure 1:
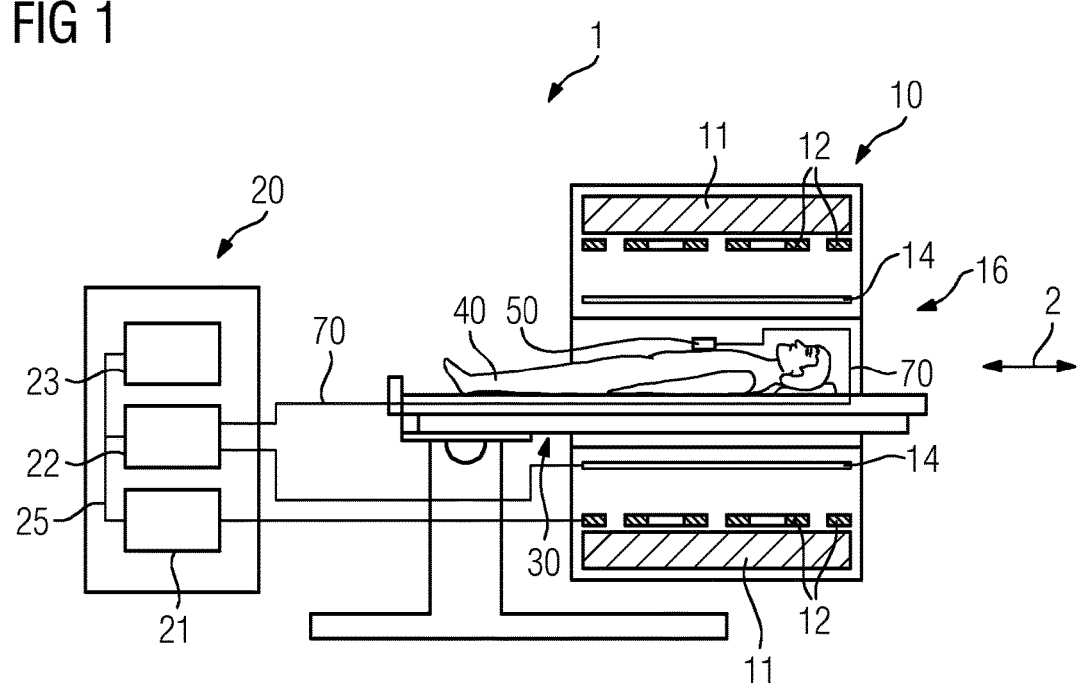
FIG. 1 shows an exemplary schematic diagram of one embodiment of a magnetic resonance tomography system.

FIG. 1 shows a schematic diagram of one embodiment of a magnetic resonance tomography system 1 having a shielded connection line 70.

The magnetic unit 10 includes a field magnet 11 that generates a static magnetic field B0 for alignment of nuclear spins of samples or in a body of a patient 40 in a recording region. The recording region is arranged in a patient tunnel 16 that extends in a longitudinal direction 2 through the magnetic unit 10. The field magnet 11 is conventionally a superconductive magnet that may provide magnetic fields having a magnetic flux density of up to 3 T, and even above this in the newest devices. For lower field strengths, permanent magnets or electromagnets having normal-conducting coils may also be used, however.

The magnetic unit 10 also includes gradient coils 12 that, for spatial differentiation of the acquired mapping regions in the examination volume, are configured to overlay the magnetic field B0 with variable magnetic fields in three spatial directions. The gradient coils 12 are conventionally coils including normal-conducting wires that may generate fields that are orthogonal to each other in the examination volume.

The magnetic unit 10 also has a body coil 14 configured to irradiate a high-frequency signal fed via a signal line into the examination volume and to receive resonance signals emitted by the patient 40 and emit the resonance signals via a signal line. The magnetic resonance tomography system of one or more of the present embodiments also includes one or more local coils 50 that are arranged in the patient tunnel 16 close to the patient 40.

A control unit 20 (e.g., a controller or a processor) supplies the magnetic unit 10 with the various signals for the gradient coils 12 and the body coil 14 and evaluates the received signals.

The control unit 20 therefore has a gradient controller 21 configured to supply the gradient coils 12 with variable currents via feed lines. The variable currents provide the desired gradient fields in the examination volume in a temporally coordinated manner.

The control unit 20 also includes a receiving unit 22 configured to generate a high-frequency pulse with a predetermined time characteristic, amplitude, and spectral power distribution in order to excite a magnetic resonance of the nuclear spins in the patient 40. Pulse powers in the region of kilowatts may be attained in the process. The individual units are connected to each other by a signal bus 25.

The local coil 50 may receive a magnetic resonance signal from the body of the patient 40, because, owing to the low spacing, the signal-to-noise ratio (SNR) of the local coil 50 is better than in the case of receiving via the body coil 14. The MR signal received by the local coil 50 is prepared in the local coil 50 and forwarded by the shielded connection line 70 of one or more of the present embodiments to the receiving unit 22 of the magnetic resonance tomography system 1 for evaluation and image acquisition.

Figure 2:
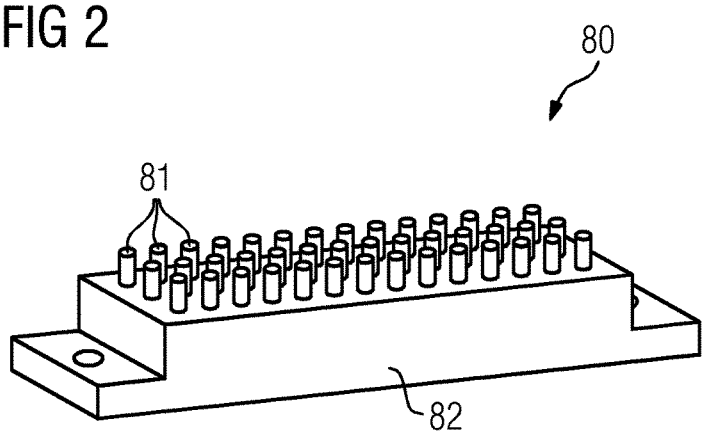
FIG. 2 shows an exemplary schematic diagram of a plug-in connector of one embodiment of a connection line.

FIG. 2 schematically illustrates one possible embodiment of a plug-in connector 80 of a connection line 70. Spring contacts 81 are arranged in a planar manner in or on a connector body 82. The arrangement may be in a regular two-dimensional pattern since this simplifies occupancy. The arrangement may be, for example, in a square or rectangular matrix, although hexagonal or other arrangements that at least partially fill a first surface of the connector body 82 may also be provided. The first surface may be flat, although curved surfaces or first surfaces that are flat only in parts may also be provided. The spring contacts 81 project from or out of this first surface (e.g., in the direction of a surface normal with respect to this first surface). Arrangements at an angle to the surface normal of the first surface may also be provided, however.

In the illustration in FIG. 2, the spring contacts 81 are configured as spring pins that have an elongate form. Extension of the spring pins may be elastically and reversibly changed under the impact of force along an axis in the direction of the greatest dimension of the spring pin. The spring contacts 81 are permanently or detachably connected (e.g., via laterally protruding latching elements) to the connector body 82. Part of the spring contact 81 may extend through the connector body 82, so at a second surface of the connector body 82, opposing the first surface, the spring contacts 81 may be contacted by a signal conductor 71 or a shield 72 (e.g., by soldering or form closure such as by a crimp connection). In one embodiment, the spring contacts 81 may be integral or may include a plurality of mechanically and electrically connected parts. The spring contacts 81 may have, for example, two sleeves that slide one inside the other and are elastically held relative to each other in a predetermined rest position by a spring coil on the inside.

Figure 3:
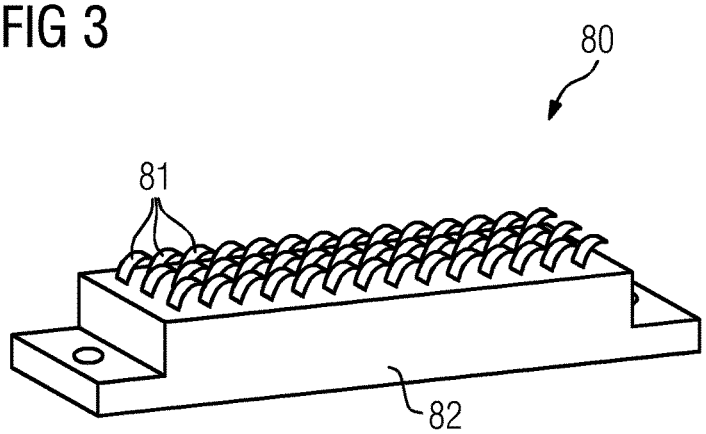
FIG. 3 shows an exemplary schematic diagram of a plug-in connector of one embodiment of a connection line.

In one embodiment, as shown in FIG. 3, the spring contacts 81 have a bar or metal strip that may be elastically bent transversely to the longitudinal extension. Spring contacts 81 of this kind may then be arranged at an angle to the surface normal (e.g., between 60 degrees and 90 degrees), so a force parallel to the surface normal reversibly bends the spring contacts 81 toward the connector body 82. A spring contact of this kind may be manufactured in one piece and extend through the connector body 82 to the second surface.

Figure 4:
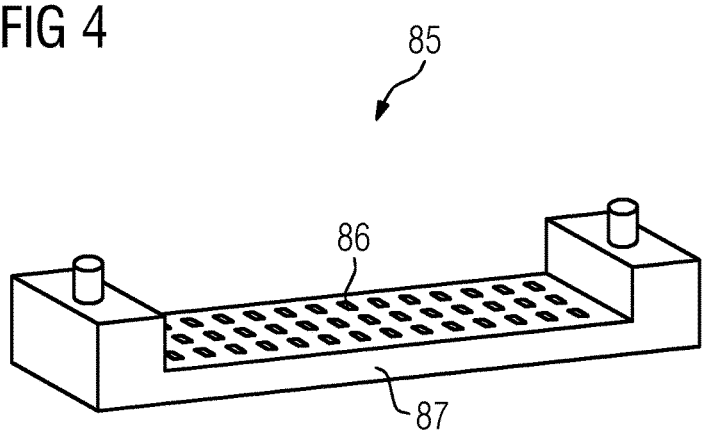
FIG. 4 shows an exemplary schematic diagram of a plug-in connector of one embodiment of a connection line.

FIG. 4 shows an embodiment of a socket 85 for a plug-in connector 80 in FIG. 2 or 3. Arranged on the socket body 87 on or at the socket 85 are corresponding electrically conductive landing surfaces 86, complementary to the spring contacts 81. Thus, when the plug-in connector 80 is plugged with the socket 85, a plurality or each of the spring contacts 81 comes into electrical contact with a corresponding landing surface 86. In this way, a connection may be established, for example, between the connection line 70 and the magnetic resonance tomography system 1. The landing surfaces may be arranged in a planar manner on the surface of the socket body 87 or also in indentations in the socket body 87. The socket 85 may be arranged on or in a surface of a housing of the magnetic resonance tomography system 1. The socket 85 may, however, be connected to the magnetic resonance tomography system 1 by a cable.

Instead of the landing surfaces 86, sleeves, for example, may also be provided in indentations in the socket body 87 in a socket 85, so when the plug-in connector 80 in FIG. 2 is plugged in, the spring contacts 81 dip into the sleeves and establish an electrical contact.

According to one or more of the present embodiments, the roles of socket 85 and plug-in connector 80 may be interchanged, so, for example, landing surfaces 86 may also be provided on the plug-in connector 80 and spring contacts 81 on the socket 85. The landing surfaces 86 in the socket 85 may, however, be configured so as to be planar with the surface of the housing of the magnetic resonance tomography system 1 and are therefore particularly easy to clean. The housing may, for example, also be the surface of a patient couch 30.

Figure 5:
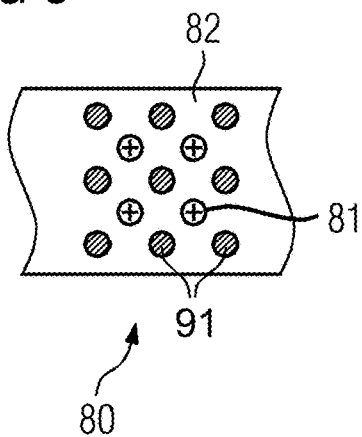
FIG. 5 shows a schematic diagram of an exemplary electrical occupancy of spring contacts of the plug-in connector.

In FIG. 5, spring contacts 81 that are electrically connected to a signal conductor 71 are identified by a "+", while spring contacts 91 filled-in black are connected to a shield 72.

In FIG. 5, spring contacts 81 that are electrically connected to a signal conductor 71 are identified by a "+", while spring contacts 81 filled-in black are connected to a shield 72.

The spring contacts identified by "+" correspond to first or third connection contacts, for example, while the spring contacts filled-in black correspond to second and fourth connection contacts, for example. One first connection contact (e.g., in the case of the plug-in connector), respectively, or third connection contact (e.g., in the case of the socket) is accordingly surrounded by four adjacent second connection contacts or fourth connection contacts. The second or fourth connection contacts are arranged at the corners of a square that surrounds the first or third connection contact.

FIG. 5 shows that in each case, four spring contacts 91 connected to a shield 72 surround one spring contact 81 that is connected to a signal conductor 71. This provides that the shield is also secured by the plug-in connector 80 and a socket 85 connected thereto. The occupancy of the landing surfaces 86 corresponds to the occupancy of the opposing spring contacts 81, 91 in each case.

With appropriate selection of spring contacts 81/landing surfaces 86 and appropriate arrangement, a spring contact 81 with connection to a signal conductor 71 may in each case be surrounded by at least three spring contacts 91 that are in electrical contact with only the shield 82 of the respective signal conductor 71. Thus, even the shields 72 of the individual signal conductors 71 may be held galvanically separately from each other on the plug-in connector 80. Interactions between the signal lines 71 may therefore be reduced further, and disconnected ground potentials may also be used, or ground loops may be avoided via the shields.

Figure 6:
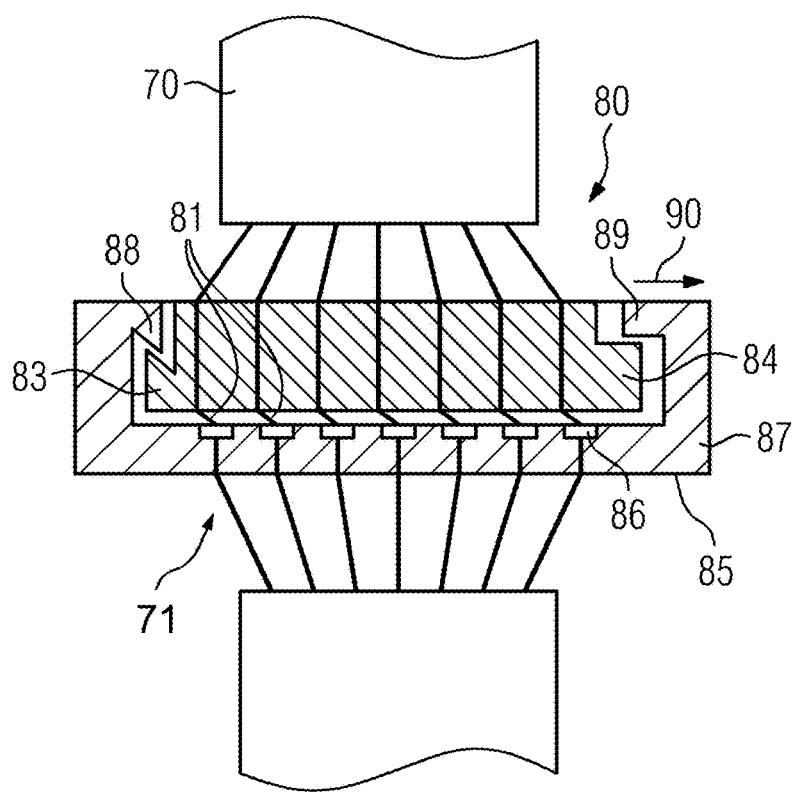
FIG. 6 shows a schematic cross-section through a plug-in connector and a socket of one embodiment of a connection line.

FIG. 6 shows a schematic cross-section through a plug-in connector 80 and a socket 85 of an embodiment of a connection line 70.

In FIG. 6, the plug-in connector 80 and the socket 85 are mutually engaged and in electrical contact, so the contact springs 81 are in electrical contact with the landing surfaces 86. As a result of corresponding spring force, the contact springs 81 press the connector body 82 away from the socket body 87, where the socket, as a result of the first undercut 88 and the second undercut 89 in conjunction with the first projection 83 and the second projection 84, are fixed in relative position, respectively. Undercut 88 and projection 83 have oblique planes, so, under the effect of the spring force of the contact springs 81, the plug-in connector is pressed counter to direction 90 relative to the socket 85 and remains in the relative position. To break the connection the plug-in connector 80 is to be moved counter to the spring force toward the socket 85 and simultaneously in the direction 90, so the first projection 83 no longer interacts with the first undercut 88. The plug-in connector 80 may then be tilted away from the socket 85 around the second projection 84 and be disengaged from the socket 85.

The first and second projections 83, 84, together with the first and the second undercut 88, 89 as retaining elements, form a restraining system for the plug-in connector 80 and the socket 85. This provides an easily detachable mechanical connection. During plugging-in and unplugging, the spring contacts 81 are moved under force across the landing surfaces 86 parallel to direction 90, so contamination or an oxide layer is penetrated and the contact closure is provided.

Although the invention has been illustrated and described in detail with reference to exemplary embodiments, the invention is not limited by the disclosed examples. A person skilled in the art may derive other variations herefrom without departing from the scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A shielded connection line usable with a magnetic resonance tomography system, the shielded connection line comprising:
   at least one signal conductor and a shield configured for the at least one signal conductor; and
   a plug-in connector comprising:
      a number of connection contacts that are arranged in a two-dimensional matrix and are electrically insulated from each other within the plug-in connector,
      wherein the at least one signal conductor is in galvanic contact with a first connection contact of the number of connection contacts
      wherein three second connection contacts of the number of connection contacts, most adjacent to the first connection contact and surrounding the first connection contact, are galvanically connected to the shield,
      wherein the three second connection contacts are arranged at positions that define the geometric corners of a polygon,
      wherein the first connection contact is arranged in an area surrounded by the positions that define the geometric corners of the polygon and
      wherein only one first connection contact is arranged in the area surrounded by the positions that define the geometric corners of the polygon.

2. The shielded connection line of claim 1, wherein the first connection contact is arranged in a surface defined by the polygon.

3. The shielded connection line of claim 2, wherein the polygon is a convex polygon.

4. The shielded connection line of claim 1, wherein the at least one signal conductor comprises a plurality of signal conductors, each signal conductor of the plurality of signal conductors having a respective shield, and
   wherein each signal conductor of the plurality of signal conductors is in galvanic contact with a respective first connection contact, and
   wherein the three respective second connection contacts, most adjacent to the respective first connection contact and surrounding the respective first connection contact, are galvanically connected to the shield of each respective signal conductor of the plurality of signal conductors.

5. The shielded connection line of claim 4, wherein the shields of the plurality of signal conductors are not in electrical contact with each other at the plug-in connector.

6. A magnetic resonance tomography (MRT) system comprising:
   a shielded connection line comprising:
      a signal conductor and a shield for the signal conductor; and a plug-in connector comprising:

a number of connection contacts that are arranged in a two-dimensional matrix and are electrically insulated from each other within the plugged-in connector, wherein the single conductor is in galvanic contact with a first connection contact of the number of connection contacts, and three second connection contacts of the number of connection contacts, most adjacent to the first connection contact and surrounding the first connection contact, that are galvanically connected to the shield; and a socket having third and fourth connection contacts, wherein the plug-in connector and the socket are configured, in a plugged-in state, to electrically connect the first and the third connection contacts to each other in pairs, respectively, and to electrically connect the second and the fourth connection contacts to each other in pairs, respectively, wherein the three second connection contacts are arranged at positions that define the geometric corners of a polygon, wherein the first connection contact is arranged in an area surrounded by the positions that define the geometric corners of the polygon and wherein only one first connection contact is arranged in the area surrounded by the positions that define the geometric corners of the polygon.

7. The MRT system of claim 6, wherein the socket in the plugged-in connector are configured such that, in the plugged-in state, a conductive path formed by a respective first connection contact and third connection contact is in each case surrounded by adjacent conductive paths that are formed by the respective second connection contacts and fourth connection contacts.

8. The MRT system of claim 6, wherein a connection contact of the first connection contact, the three second connection contacts, a respective third connection contact or a respective fourth connection contact has a spring contact as the connection contact.

9. The MRT system of claim 8, wherein the socket and plug-in connector have a restraining system having corresponding retaining elements that are arranged and configured such that, under pressure of one or more spring contacts, the retaining elements detachably fix the plug-in connector in a predetermined relative position in relation to the socket.

10. The MRT system of claim 6, wherein the socket has planar landing surfaces as a connection contact of the third and fourth connection contacts.

11. A local coil that is usable when performing magnetic resonance tomography (MRT) comprising:

A shielded connection line which connects to the local coil comprising:

at least one signal conductor and a shield configured for the at least one signal conductor; and a plug-in connector comprising:

a number of connection contacts that are arranged in a two-dimensional matrix that are electrically insulated from each other within the plug-in connector, wherein the at least one signal conductor is in galvanic contact with a first connection contact of the number of connection contacts, wherein three second connection contacts of the number of connection contacts, most adjacent to the first connection contact and surrounding the first connection contact, are galvanically connected to the shield, wherein the three second connection contacts are arranged at positions that define the geometric corners of a polygon, wherein the first connection contact is arranged in an area surrounded by the positions that define the geometric corners of the polygon and wherein only one first connection contact is arranged in the area surrounded by the positions that define the geometric corners of the polygon.

12. The shielded connection line of claim 11, wherein the first connection contact is arranged in a surface defined by the polygon.

13. The local coil of claim 12, wherein the polygon is a convex polygon.

14. The local coil of claim 11, wherein the at least one signal conductor comprises a plurality of signal conductors, each signal conductor of the plurality of signal conductors having a respective shield, and wherein each signal conductor of the plurality of signal conductors is in galvanic contact with a respective first connection contact, and wherein the three respective second connection contacts, most adjacent to the respective first connection contact and surrounding the respective first connection contact, are galvanically connected to the shield of each respective signal conductor of the plurality of signal conductors.

15. The local coil of claim 14, wherein the shields of the plurality of signal conductors are not in electrical contact with each other at the plug-in connector.

16. A magnetic resonance tomography system comprising:

A local coil that is usable when performing magnetic resonance tomography comprising:

a signal connection with a magnetic resonance tomography system by a system, the system comprising:

a shielded connection line comprising:

a signal conductor and a shield for the signal conductor; and a plug-in connector comprising:

a number of connection contacts that are arranged in a two-dimensional matrix and are electrically insulated from each other within the plug-in connector, wherein the at least one signal conductor is in galvanic contact with a first connection contact of the number of connection contacts, and wherein three second connection contacts of the number of connection contacts, most adjacent to the first connection contact and surrounding the first connection contact, are galvanically connected to the shield, and a socket having third and fourth connection contacts, wherein the plug-in connector and the socket are configured, in a plugged-in state, to electrically connect the first and the third connection contacts to each other in pairs, respectively, and to electrically connect the second and the fourth connection contacts to each other in pairs, respectively, wherein the three second connection contacts are arranged at positions that define the geometric corners of a polygon, wherein the first connection contact is arranged in an area surrounded by the positions that define the geometric corners of the polygon and wherein only one first connection contact is arranged in the area surrounded by the positions that define the geometric corners of the polygon.

* * * * *